United States Patent [19]

Sato

[11] Patent Number: 4,916,669
[45] Date of Patent: Apr. 10, 1990

[54] SEMICONDUCTOR MEMORY

[75] Inventor: Katsuyuki Sato, Kodaira, Japan

[73] Assignee: Hitachi, Ltd., Tokyo, Japan

[21] Appl. No.: 196,262

[22] Filed: May 20, 1988

[30] Foreign Application Priority Data

May 27, 1987 [JP] Japan .................................. 62-128198

[51] Int. Cl.$^4$ .............................................. G11C 11/34
[52] U.S. Cl. ........................... 365/230.05; 365/189.04
[58] Field of Search ............... 365/189, 219, 220, 221,
365/230, 231, 235, 238, 218, 149, 230.03,
230.05, 189.04, 189.05, 189.01

[56] References Cited

PUBLICATIONS

M. Ishihara et al., "Dual Port Memory For 256K Image with Serial Input Function and Raster Operation Function", Nikkei Electronics, Mar. 24, 1986, published by Nikkei McGraw-Hill Co., Ltd., pp. 243–264.

*Primary Examiner*—Joseph A. Popek
*Attorney, Agent, or Firm*—Antonelli, Terry & Wands

[57] ABSTRACT

A semiconductor memory of a dual-port type which has input/output circuits and which has respective semiconductor memory units having a memory array of rows and columns of memory cells, a pluraliity of sense amplifiers coupled to one end of the memory array data lines and being respectively associated with individual pairs of complementary data lines, a row address decoder for selectively applying signals to the word lines, column switches for providing either selective or simultaneous connection of the plurality of complementary pairs of data lines to a pair of complementary common data lines, write amplifiers for supplying predetermined write signals to respective data lines via the common data lines and column switches, the sense amplifiers becoming operational during a predetermined mode of operation subsequent to the transfer of write signals to the data lines and the write signals being supplied from the write amplifiers are, furthermore, made to have a minute level equal to or greater than that of a typical readout signal from a memory cell.

16 Claims, 4 Drawing Sheets

SEMICONDUCTOR MEMORY

BACKGROUND OF THE INVENTION

This invention relates to a semiconductor memory, and an effective technology for applying the invention, for example, to a dual-port memory (multi-port memory) having a sense amplifier and the like.

There is available a dual-port memory having both a random access port and a serial access port. The dual-port memory is often used as, for example, a picture frame buffer memory for displaying characters, figures, or the like on the face of a CRT(cathode-ray tube). For this purpose, the random access port and the serial access port of the dual-port memory are provided with a plurality of data input/output terminals and data input/output circuits to which memory data are input/output every 4 bits or 8 bits, respectively. Each of the bits is made to correspond to each of color factors of displayed pictures.

The dual-port memory is reported on, for example, pp 243 through 264, "Nikkei Electronics" dated Mar. 24, 1986 published by Nikkei McGraw-Hill Co., Ltd.

In the case where the dual-port memory is used as a picture frame buffer memory, for example, when the background color of the displayed picture is altered, the so-called clear function by which stored data in all memory cells corresponding to a specific color factor of the stored picture is rewritten into the same data at a high speed is said to be effective. Also, it is desirable for the clear function to allow the serial output operation based on the serial access port to be executed while the picture is displayed, in other words, without a break of the above operation.

The above-reported dual-port memory is provided with a random acess port which is randomly accessible irrespective of a state of operation of the serial access port. The random access port is prepared with the so-called write per bit function by which maskable write is executed in accordance with the mask data supplied in advance from the outside. The use of the write per bit function allows the clear operation corresponding to the color factor to be realized. Since the clear operation using the write per bit function can not, however, help by being executed, for example, every 4 bits or 8 bits, a considerable amount of time is needed before a series of picture data are rewritten.

SUMMARY OF THE INVENTION

For dealing with this problem, the inventors of the present invention devised that the same picture data are simultaneously written into a plurality of memory cells connected to the selected word lines with all data lines of memory arrays held simultaneously in a state of selection. However, this simultaneous write operation is executed at the point in time when the selecting operation for word lines ends and readout signals for the selected memory cells are amplified by the sense amplifier in the same way as in a normal write operation shown in FIG. 4. In this time, the write amplifier can not help forcibly inverting the levels of a plurality of complementary data lines which are simultaneously brought into a state of selection in accordance with the write data. The value of the write current supplied from the write amplifier is, therefore, made extremely large. As a result, even the realization of the simultaneous write operation has been difficult especially in a dual-port memory and the like which have been made bulky in capacity. The object of this invention is to provide a semiconductor memory unit having a new function.

Another object of this invention is to attempt high speed and low power consumption for a clear operation of a dual-port memory and the like.

The above-mentioned and another objects and new features of this invention will be clarified with reference to the description in this specification and attached drawings.

A simple description of the summary of the typical one among embodiments disclosed in the present application is as follows.

In other words, clear operation modes of the dual-port memory and the like are executed for all for the memory cells corresponding to each selection of a word line with all data lines being held simultaneously in a state of selection when a word line selection is made. In this time, the write amplifier is temporarily brought into an operational state before a selecting operation for the word lines starts since all data lines are brought into a state of selection, and the level of the write signal output from the write amplifier is a minute level equal to or greater than that of the readout signal output from the memory cell.

Since the write signal of a sufficiently minute level so as to allow inversion of the readout signal output from the memory cell permits a write operation to be executed during selection of each word line according to the above-mentioned means, the means allows the clear operation modes of the dual-port memory and the like to be executed at a high speed and, furthermore, under low power consumption.

DESCRIPTION OF THE PREFERRED EMBODIMENT

Figure 2:
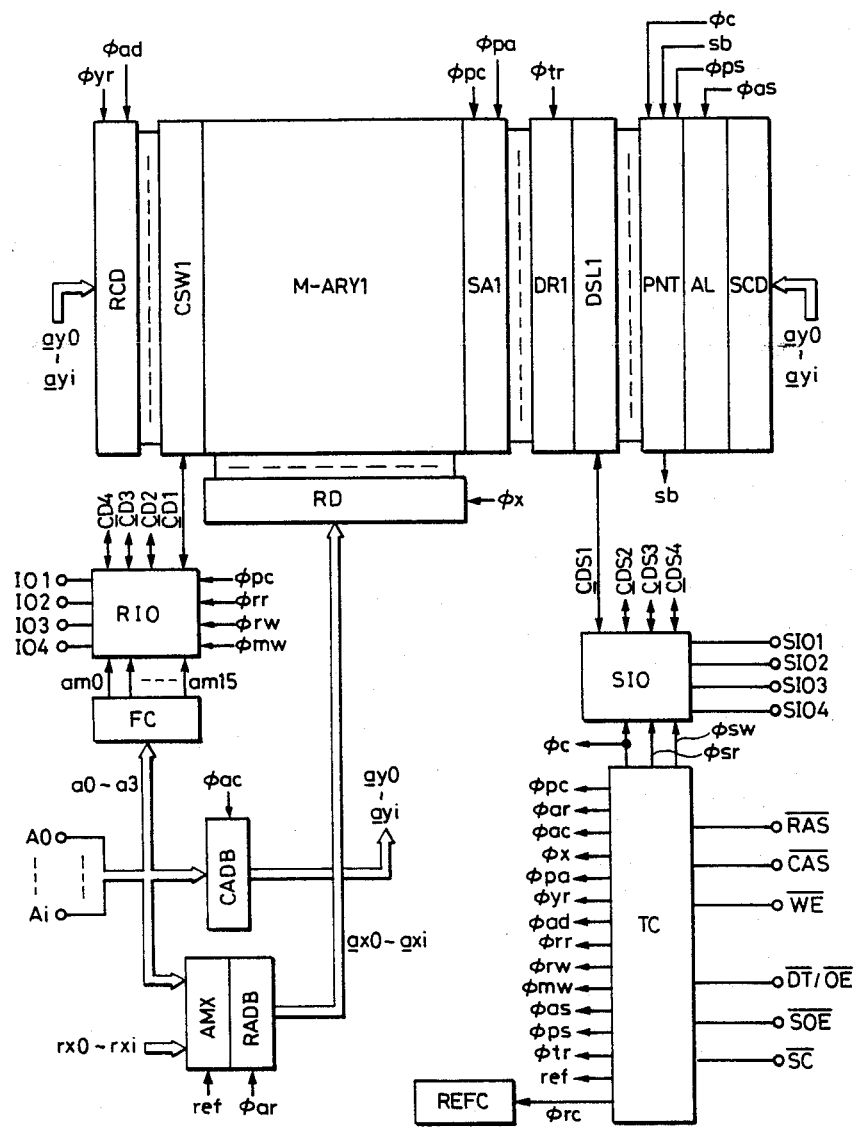
FIG. 2 is a block diagram showing an embodiment of a dual-port memory including the random input/output circuits shown in FIG. 1.

In FIG. 2, a block diagram of an embodiment of a dual-port memory applied according to the present invention is shown. Circuit elements composing each block shown in the same diagram are not subjected to any limitation in particular, but they are formed on a substrate made of semiconductors such as single crystal silicon by the known manufacturing technology for semiconductor integrated circuits.

The dual-port memory in this embodiment is not subjected to any limitation in particular, but it contains a random access port which usually performs random input/output operations for stored data every 4 bits using a dynamic RAM as a fundamental component and a serial access port which performs serial input/output operations for every word line. In this embodiment, the random access port has a clear function by which all complementary data lines are simultaneously brought into a state of selection and the same stored data is simultaneously written when the dual-port memory is brought into a fixed clear operation mode. In this time, the level of the write signal supplied to the corresponding complementary data lines from each of the write amplifiers in the random input/output circuits is made to be a minute level equal to or greater than that of the readout signal read from the memory cell. Each of the write amplifiers is selectively brought into an operational state in accordance with mask data supplied in advance. By this, the dual-port memory in this embodiment has a function by which random access at every 4 bits or a clear operation for every word line is maskably executed for every bit which is associated with each color factor together with the serial input/output operation based on the serial access port, in other words, while data necessary for picture display are output.

Figure 1:
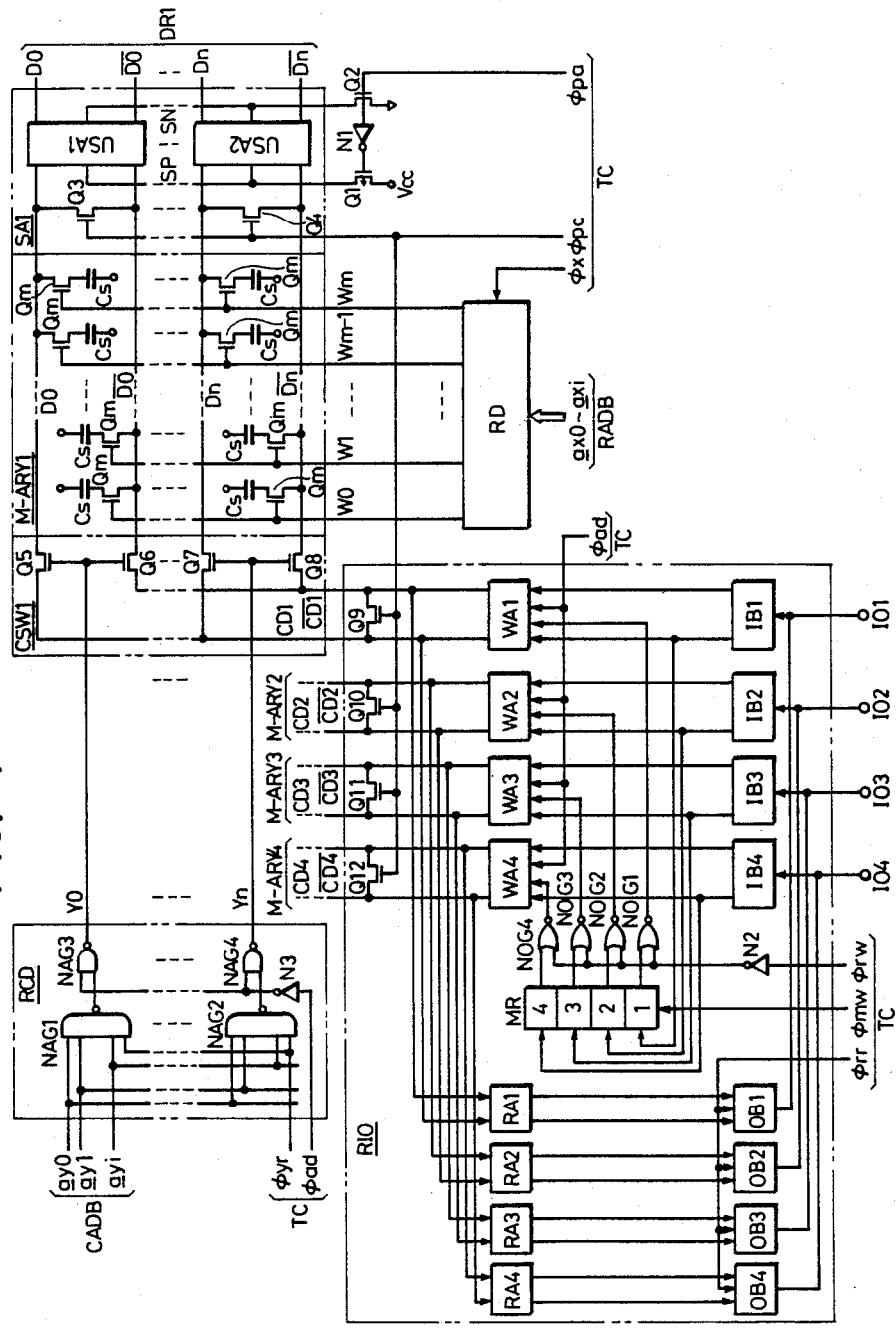
FIG. 1 is a circuit diagram showing an embodiment of random input/output circuits and their circumferences.

The random access port of the dual-port memory in this embodiment is not subjected to any limitation in particular, but it is provided with four sets of memory arrays M-ARY 1 through M-ARY 4, and with sense amplifiers SA 1 through SA 4 and column switches CSW 1 through CSW 4 which are respectively associated with the respective memory arrays. Also, a column address decoder RCD and a row address decoder RD for the random access port are provided in common with the memory arrays M-ARY 1 through M-ARY 4. Sometimes, a plurality of these address decoders are provided in accordance with the arrangement of the memory arrays on the semiconductor substrate. In FIG. 1 and FIG. 2, the memory arrays and the corresponding peripheral circuits associated therewith are shown illustratedly.

In FIG. 2, the memory array M-ARY 1 is composed of m+1 word lines W0 through Wm arranged in the vertical direction in the same diagram, n+1 sets of complementary data lines D0·$\overline{D0}$ through Dn·$\overline{Dn}$ arranged in the horizontal direction in the same diagram and (m+1)×(n+1) dynamic-type memory cells arranged at the intersections of these word lines and complementary data lines.

Each of the memory cells is composed of a capacitor Cs for storing information and an N-channel MOSFET Qm for selecting an address. Each of the gates of the address selecting MOSFET Qms of the (m+1) memory cells arranged on the same column of the memory array M-ARY 1 is coupled with each of the corresponding word lines W0 through Wm. Also, each of the drains of the address selecting MOSFET Qms in the (n+1) memory cells arranged on the same row of the memory array M-ARY1 is alternately coupled with each of the non-inverted signal lines or the inverted signal lines of the corresponding complementary data lines D0·$\overline{D0}$ through Dn·$\overline{Dn}$ in accordance with fixed or regular intervals as input/output nodes of the memory cells.

The word lines of the memory array M-ARY 1 are coupled with the row address decoder RD and are alternatively brought into a state of selection. The row address decoder RD is supplied with complementary internal address signals $\underline{ax0}$ through $\underline{axi}$ of i+1 bits (Here, the address signals are represented like the complementary internal addess signals ax0, for example, by putting a non-inverted internal add$\underline{res}$s signal ax0 and an inverted internal address signal $\overline{ax0}$ together, and so forth.) from a row address buffer RADB and supplied with a timing signal $\phi x$ from a timing control circuit TC.

The row address decoder RD is selectively brought into an operational state by setting the timing signal $\phi x$ at a high level. In this operational state, the row address decoder RD decodes the complementary internal address signals $\underline{ax0}$ through $\underline{axi}$ so as to bring the corresponding word lines alternatively into a high level state of selection.

The row address buffer RADB takes in row address signals supplied from an address multiplexer AMX and holds them. Also, based on these row address signals, the row address buffer RADB forms the complementary internal address signals ax0 through $\underline{axi}$, which are supplied to the row address decoder $\overline{RD}$.

The dual-port memory in this embodiment is not subjected to any limitation in particular, but it adopts the so-called multiplex system in which X address signals AXo through AXi for specifying the row addresses and Y address signals AY0 through AYi for specifying column addresses are supplied via common external terminals A0 through Ai on the basis of time division. The external terminals A0 through Ai are supplied with the X address signals AX0 through AXi in synchronism with the trailing edge of a row address strobe signal $\overline{RAS}$ and supplied with the Y address signals AY0 through AYi in synchronism with the trailing edge of a column address strobe signal $\overline{CAS}$. Furthermore, the dual-port memory in this embodiment is provided with an automatic refresh mode for reading out and rewriting data stored in memory cells within a fixed period and a refresh address counter REFC for specifying word lines to be refreshed in order. For this, the dual-port memory in this embodiment is provided with an address multiplexer AMX which selectively transfers the X address signals AX0 through AXi or refresh address signals rx0 through rxi formed by the refresh address counter REFC to the row address buffer RADB. The address multiplexer AMX is supplied with an internal control signal ref from a timing control circuit TC as a selection control signal.

The address multiplexer AMX is not subjected to any limitation in particular, but when the internal control signal ref is brought into a low level state, and the dual-port memory is brought into a normal operation mode, the multiplexer AMX selects the X address signals AX0 through AXi supplied via the external terminals A0 through Ai and transfers them as the row address signals to the row address buffer RADB. Also, when the internal control signal ref is brought in a high level, and the dual-port memory is brought into an automatic refresh mode, the refresh address signals rx0 through rxi output from the refresh address counter REFC are selected and transferred to the row address buffer RADB as the row address signals.

As described previously, the X address signals AX0 through AXi are supplied in synchronism with the trailing edge of the row address strobe signal $\overline{RAS}$. The row address buffer RADB takes in the row address signals, therefore, in accordance with a timing signal $\phi$ar formed by detecting the trailing edge of the row address strobe signal $\overline{RAS}$ in the timing control circuit TC.

On the other hand, the complementary data lines D0·$\overline{D0}$ through Dn·$\overline{Dn}$ which compose the memory array M-ARY1 are coupled on one end thereof with respective MOSFET switches of the corresponding column switch CSW1, and further are selectively connected to the corresponding common data lines $\underline{CD1}$ via these switches MOSFET. (Here, for example, the complementary common data line is represented as shown by $\underline{CD1}$ by putting the non-inverted signal line CD1 and the inverted signal line $\overline{CD1}$ together, and so forth.)

The column switch CSW1 is composed of (n+1) pairs of MOSFET switches. Terminals on one side of these switches MOSFET are coupled with the corresponding complementary data lines, respectively, and terminals on the other side thereof are connected in common to the non-inverted signal line CD1 or the inverted signal line $\overline{CD1}$ which constitutes the complementary common data line, respectively. Gates of each pair of MOSFET switches are coupled in common with each other and are supplied with data line selecting signals Y0 through Yn from the random access port column address decoder RCD, respectively. By this, the column switch CSW1 has a function by which the specified complementary data lines $D0 \cdot \overline{D0}$ through $Dn \cdot \overline{Dn}$ in the memory array M-ARY1 are selectively connected to the corresponding common complementary data lines CD1 in accordance with the data line selecting signals Y0 through Yn.

The random access port column address decoder RCD is supplied with complementary internal address signals ay0 through ayi of i+1 bits from the column address buffer CADB and timing signals $\phi$yr and $\phi$ad from the timing control circuit TC. Among them, the timing signal $\phi$yr is not subjected to any limitation in particular, but it is set at a low level when the dual-port memory is into a non-selection state and is set at a high level at the point in time when selecting operation of the data lines can begin when the dual-port memory is brought into a selection state during its normal operation mode. Also, the timing signal $\phi$ad is set at a low level when the dual-port memory is placed in a non-selection state and is temporarily set at a high level, before the selecting operation of the word lines begins, when the dual-port memory is placed in a selection state of operation during its clear operation mode.

The random access port column address decoder RCD decodes the complementary internal address signals ay0 through ayi supplied from the column address buffer CADB when the dual-port memory is placed into its normal operational mode and sets the corresponding data line selecting signals Y0 through Yn alternatively at a high level in accordance with the timing signal $\phi$yr. Also, the decoder RCD temporarily brings the data line selecting signals Y0 through Yn simultaneously in a high level in accordance with the timing signal $\phi$ad.

The column address buffer CADB is supplied with the Y address signals AY0 through AYi via the external terminals A0 through Ai and a timing signal $\phi$ac from the timing control circuit TC. This timing signal $\phi$ac is brought temporarily in a high level when the column address strobe signal $\overline{CAS}$ is changed from a high level to a low level.

The column address buffer CADB takes in and holds the Y address signals AY0 through AYi supplied by time sharing via the external terminals A0 through Ai. Also, based on these Y address signals AY0 through AYi, the buffer CADB forms the complementary internal address signals ay0 through ayi and supplies them to the random access port column address decoder RCD.

The complementary data lines $D0 \cdot \overline{D0}$ through $DN \cdot \overline{Dn}$ in the memory array M-ARY1 are coupled on the other end thereof with corresponding unit amplifying circuits in the sense amplifier SA1 and, furthermore, are respectively coupled with corresponding unit circuits in a data register DR1 provided at the serial access port.

The sense amplifier SA1 includes n+1 unit amplifying circuits and pre-charging circuits, each one being associated with a corresponding pair of complementary data lines $D0 \cdot \overline{D0}$ through $Dn \cdot \overline{Dn}$. Among them, each of the unit amplifying circuits has a latch, as a basic composition which is comprised of two sets of a CMOS inverter circuit cross-connected with each other, as will be described later. These unit amplifying circuits are supplied in common with a timing signal $\phi$pa from the timing control circuit TC. The timing signal $\phi$pa is set at a high level at the time point when word line selecting operation ends in the memory array M-ARY1 through M-ARY4.

Each of the unit amplifying circuits in the sense amplifier SA1 is simultaneously brought into an operational state by setting the timing signal $\phi$pa at a high level. In this operational state, each of the unit amplifying circuits in the sense amplifier SA1 amplifies a minute readout signal which corresponds to the stored level in the memory cell, which is outputted therefrom to a corresponding complementary data line and makes a binary readout signal of a high or low level.

On the other hand, the pre-charging circuits in the sense amplifier SA1 are not subjected to any limitation in particular, but they are composed of short-circuiting MOSFET switches of an N-channel type respectively provided between each non-inverted signal line and each corresponding pair inverted signal line of each of complementary data lines $D0 \cdot \overline{D0}$ through $Dn \cdot \overline{Dn}$. All of the gates of these MOSFET switches are coupled in common and supplied with a timing signal $\phi$pc from the timing control circuit TC. This timing signal $\phi$pc is set at a high level when the dual-port memory is placed in a non-selection state and it is set at a low level when the dual-port memory is placed in a selection state.

The switch MOSFET which respectively comprise the pre-charging circuits in the sense amplifier SA1 are simultaneously switched into an ON state operating condition when the dual-port memory is placed in a non-selection state, and the timing signal $\phi$pc is set at a high level. By this, both signal lines of each pair of complementary data lines $D0 \cdot \overline{D0}$ through $Dn \cdot \overline{Dn}$ are short-circuited, wherein the level thereat is pre-charged to about ½ times the power source voltage Vcc. When the dual-port memory is brought into a state of selection, and the timing signal $\phi$pc is brought in a low level, the switch MOSFET composing the pre-charging circuit is switched into an OFF state.

The complementary common data lines CD1 are coupled with a random input/output circuit $\overline{RIO}$. The complementary common data lines CD2 through CD4 which correspond to the memory arrays M-ARY2 through M-ARY4, respectively, are also similarly coupled with this random input/output circuit RIO similarly.

The random input/output circuit RIO includes four sets of write amplifiers WA1 through WA4 and read amplifiers RA1 through RA4. which are respectively provided with respect to each pair of complementary common data lines CD1 through CD4 and wherein it further includes four sets of input buffers IB1 through IB4 and output buffers OB1 through OB4 which are associated with the write amplifiers and read amplifiers, respectively. Furthermore, the random input/output circuit RIO includes a mask register MR holding mask data for bringing the write amplifiers WA1 through WA4 into an operational state selectively and pre-charging circuits which are respectively provided for the complementary common data lines CD1 through CD4. The write amplifiers WA1 through WA4 are not subjected to any limitation in particular, but they are selectively supplied with a timing signal $\phi rw$ from the timing control circuit TC in accordance with the output signal of the mask register MR. Also, the output buffers OB1 through OB4 are supplied with the timing signal $\phi rr$. Furthermore, the mask register MR is supplied with a timing signal $\phi mw$ from the timing control circuit TC, and the pre-charging circuit is provided with the timing signal $\phi pc$.

The write amplifiers WA1 through WA4 in the random input/output circuit RIO are selectively brought into an operational state in accordance with the timing signal $\phi rw$ when the dual-port memory is brought into a normal write operation mode or a clear operation mode. In this operational state, the write amplifiers WA1 through WA4 transfer write data supplied via the input buffers IB1 through IB4 from corresponding input/output terminals IO1 through IO4 to the corresponding complementary common data lines CD1 through CD4.

The output buffers OB1 through OB4 in the random input/output circuit RIO are selectively brought into an operational state in accordance with a timing signal $\phi rr$ when the dual-port memory is brought into a readout operation mode. In this operation state, the output buffers OB1 through OB4 send out readout data output from the corresponding read amplifiers RA1 through RA4 to the outside from the corresponding input/output terminals IO1 through IO4.

The mask register MR in the random input/output circuit RIO takes in mask data supplied via the input buffers IB1 through IB4 from the input/output terminals IO1 through IO4 in accordance with the timing signal $\phi mw$ and holds the mask data.

The pre-charging circuit in the random input/output circuit RIO is not subjected to any limitation in particular, but it is composed of short-circuiting MOSFET switches of an N channel type provided between the non-inverted signal line and the inverted signal line of the complementary common data lines CD1 through CD4. These MOSFET switches are simultaneously brought into an ON state when the dual-port memory is brought into a state of selection and the timing signal $\phi pc$ is brought in a high level, wherein the switches effect the same half pre-charging level as do the complementary data lines D0·$\overline{D0}$ through Dn·$\overline{Dn}$ by short-circuiting the signal lines of the respective pairs of complementary common data lines CD1 through CD4.

The write amplifiers WA1 through WA4, the read amplifiers RA1 through RA4, the input buffers IB1 through IB4, the output buffers OB1 through OB4, the mask register MR, and the pre-charging circuits will be described in detail later.

The random input/output circuit RIO further includes an arithmetic logical operation circuit having functions for various operations such as raster operation and the like. The operation mode performed by this arithmetic logical operation circuit is alternatively specified by operation mode signals am0 through am15 supplied from a function control circuit FC.

The function control circuit FC includes a register for taking in and holding operational codes supplied via the external terminals A0 through A3 and a decoder which decodes these operational codes and forms the operation mode signals am0 through am15, alternatively. The operational codes are not subjected to any limitation in particular, but they are supplied to the dual-port memory via the external terminals A0 through A3 in an operation mode setting cycle in which the column address strobe signal $\overline{CAS}$ is brought in a low level prior to the row address strobe signal $\overline{RAS}$ and similarly, a write enable signal $\overline{WE}$ is brought in a low level.

On the other hand, the serial access port of the dual-port memory in this embodiment is not subjected to any limitation in particular, but it is composed of data registers DR1 through DR4 and data selectors DSL1 through DSL4, both of which are provided correspondingly to the M-ARY1 through M-ARY4, a pointer PNT, an address latch AL, a serial access port column address decoder SCD, and a serial input/output circuit SIO, all of which are provided in common at these data registers and data selectors, and a serial input/output circuit SIO. Sometimes a plurality of the pointers PNT, address latches AL, and serial access port column address decoders SCD are provided, depending upon the arrangement of memory arrays on the semiconductor substrate. In FIG. 2, the memory array M-ARY1, and the data register DR1 and the data selector DSL1 both corresponding to the above memory array are illustratedly shown.

In FIG. 2, the data register DR1 is not subjected to any limitation in particular, but it includes n+1 latches provided correspondingly to the complementary data lines D0·$\overline{D0}$ through Dn·$\overline{Dn}$ in the memory array M-ARY1. Between input/output nodes of these latches and the corresponding complementary data lines in the memory array M-ARY1 are provided n+1 pairs of MOSFET switches. These MOSFET switches are selectively brought into an ON state in accordance with a data transfer timing signal $\phi tr$ supplied from the timing control circuit TC.

An input/output node of each latch comprising the data register DR1 is selectively connected to a serial input/output complementary common data line CDS1 via the corresponding switch MOSFET in the data selector DSL1.

The data selector DSL1 is composed of n+1 pairs of switches MOSFET like the above-mentioned column switch CSW1. Each pair of MOSFET switches in the data selector DSL1 is coupled with the corresponding bit in the data register DR1 on one side and connected in common to the serial input/output complementary common data line CDS1 on the other side. Gates of each pair of MOSFET switches are connected in common respectively and corresponding data register selecting signals S0 through Sn are supplied from the pointer PNT.

The pointer PNT is not subjected to any limitation in particular, but it has a shift register of n+1 bits provided correspondingly to each switch MOSFET in the data selector DSL1 as a basic component. An output signal sb of the final bit of the pointer PNT is supplied to an input terminal for the first bit. The pointer PNT is supplied with a timing signal $\phi c$ for shift lock from the timing control circuit TC.

The pointer PNT performs loop-like shift operation in accordance with the timing signal $\phi c$ and forms data register selecting signals S0 through Sn in order. These register selecting signals S0 through Sn are supplied to the gates connected in common of the corresponding switch MOSFET in the data selector DSL1.

Each bit in the pointer PNT is further coupled with the corresponding bit in the address latch AL via the corresponding switch MOSFET respectively. The gates of these MOSFET switches are all coupled in common and are supplied with a timing signal $\phi$ps from the timing control circuit TC. The timing signal $\phi$ps is brought into a state of selection when the dual-port memory is in a readout data transferring cycle or a write data transferring cycle, and is temporarily brought in a high level at the point in time when decoding operation of the column address owing to the serial access port column address decoder SCD has ended, and a data transfer control signal $\overline{DT/OE}$ has been returned to a high level. These MOSFET switches in the pointer PNT are simultaneously brought into an ON state when the timing signal $\phi$ps is temporarily brought in a high level.

The address latch AL is composed of latches of n+1 bits provided correspondingly to each bit in the pointer PNT. Input/output nodes of these latches are further connected to the corresponding output terminals in the serial access port column address decoder SCD via the corresponding MOSFET switches, respectively. The gates of these MOSFET switches are all connected in common and supplied with a timing signal $\phi$as from the timing control circuit TC. The timing signal $\phi$as is brought into a state of selection when the dual-port memory is in a readout data transferring cycle or in a write data transferring cycle, and it is temporarily brought in a high level at the point in time when decoding operation of the column address owing to the serial access port column address decoder SCD has ended. These MOSFET switches in the address latch AL are simultaneously brought into an ON state when the timing signal $\phi$as is set at a high level.

The serial access port column address decoder SCD is supplied with complementary internal address signals ay0 through ayi from the column address buffer CADB. The serial access port column address decoder SCD decodes these complementary internal address signals ay0 through ayi and provides an output signal corresponding to one set of the complementary data lines specified by the Y address signals AY0 through AYi alternatively in a high level.

This output signal of a high level is put in the corresponding bit in the address latch AL when the timing signal $\phi$as is brought in a high level as described previously, and it is set as a shift signal of a logical value "1" to the corresponding bit in the pointer PNT when the timing signal $\phi$ps is set at a high level. The shift signal set to the corresponding bit in the pointer PNT is not subjected to any limitation in particular, but it is shifted in the shape of a loop in the pointer PNT in synchronism with the trailing edge of the timing signal $\phi$c.

In short, in the serial input/output mode based on the serial access port, the column address of readout data to be output at first, that is, the first column address is specified by the Y address signals AY0 through AYi, that is, the complementary internal address signals ay0 through ayi. These complementary internal address signals ay0 through ayi are decoded by the serial access port column address decoder SCD, and a selecting signal of a high level is input to the bit corresponding to the first column address in the address latch AL in accordance with the timing signal $\phi$as. This selecting signal is further input to the corresponding bit in the pointer PNT in accordance with the timing signal $\phi$ps and made to be a shift signal of a logical value "1".

When serial input/output operation for stored data begins, the pointer PNT is supplied with the timing signal $\phi$c for shift. The shift signal of a logical value "1" set to the designated bit in the pointer PNT is shifted in the shape of a loop in the pointer PNT in synchronism with the trailing edge of this timing signal $\phi$c to form the data register selecting signals S0 through Sn in order. Accordingly, the MOSFET switches in the data selector DSL1 are brought into an ON state in order, and each bit in the data register DR1 is alternatively connected to the serial input/output complementary common data line $\overline{CDS1}$ in order from the bit corresponding to the first column address. By this, in the serial access port of the dual-port memory in this embodiment, serial input/output operation can begin from an arbitrary column address.

The serial input/output complementary common data line $\overline{CDS1}$ is coupled with a serial input/output circuit SIO. The serial input/output circuit SIO is similarly coupled with the complementary common data lines $\overline{CDS2}$ through $\overline{CDS4}$ provided correspondingly to the memory array M-ARY2 through ARY4.

The serial input/output circuit SIO includes four sets of a main amplifier, a data input buffer, and a data output buffer and wherein each such set corresponds to one of the serial input/output complementary common data lines $\overline{CDS1}$ through $\overline{CDS4}$ and to a corresponding one of the serial input/output terminals SIO1 through SIO4.

The data output buffer in the serial input/output circuit SIO is supplied with the timing signal $\phi$sr of a high level from the timing control circuit TC when the dual-port memory is brought into a serial output mode, and consequently, it is selectively brought into an operational state. In this operational state, the data output buffer sends out readout data output via the corresponding main amplifier from the corresponding serial input/output complementary data lines $\overline{CDS1}$ through $\overline{CDS4}$ to the corresponding serial input/output terminals SIO1 through SIO4 in accordance with the timing signal $\phi$c.

The data input buffer in the serial input/output circuit SIO is supplied with the timing signal $\phi$sw of a high level from the timing control circuit TC when the dual-port memory is brought into a serial input mode, and consequently, it is selectively brought into an operational state. In this operational state, the data input buffer transfers write data supplied via the corresponding serial input/output terminals SIO1 through SIO4 from an external device to the corresponding serial input/output complementary common data lines $\overline{CDS1}$ through $\overline{CDS4}$ as complementary write signals in accordance with the timing signal $\phi$c.

The timing signal control circuit TC forms the various kinds of timing signals and internal control signals based on the row address strobe signal $\overline{RAS}$, the column address strobe signal $\overline{CAS}$, the write enable signal $\overline{WE}$, the data transfer control signal $\overline{DT/OE}$, and the serial output control signal $\overline{SOE}$, and then supplied these signals to each circuit. Also, the timing signal control circuit TC forms the timing signal $\phi$c, based on the serial clock signal SC supplied from the outside and then supplies the signal to the pointer PTN and serial input/output circuit SIO.

FIG. 1 shows a circuit diagram of an embodiment of the random input/output circuit and its circumferential parts in the dual-port memory shown in FIG. 2. In FIG. 1, the MOSFET added with an arrow at its channel (back gate) part is of a P-channel type. In FIG. 1, blocks not directly related to this invention are omitted like the arithmetic logical operation circuit in the random input/output circuit RIO and so forth.

In FIG. 1, each memory cell in the memory array M-ARY1 is composed of an information storing capacitor Cs and an address selecting MOSFETQm. Gates of address selecting MOSFETQms in n+1 memory cells arranged on the same row of the memory array M-ARY1 are connected in common to the corresponding word lines W0 through Wm respectively. These word lines W0 through Wm are further coupled with the row address decoder RD and alternatively brought into a high level state of selection in accordance with the complementary internal address signals ax0 through axi.

On the other hand, drains of address selecting MOSFETQms of m+1 memory cells arranged on the same column in the memory array M-ARY1 are alternately coupled with the non-inverted signal line or the inverted signal line of the corresponding complementary data lines D0·$\overline{D0}$ through Dn·$\overline{Dn}$ at fixed or regular intervals. These complementary data lines D0·$\overline{D0}$ through Dn·$\overline{Dn}$ are coupled with the corresponding unit amplifying circuits USA1 through USA2 via the corresponding pre-charging MOSFETQ3 through MOSFETQ4 in the sense amplifier SA1 on one side.

All of the gates of the pre-charging MOSFETQ3 through MOSFETQ4 are connected in common and supplied with the timing signal $\phi$pc from the timing control circuit TC. The pre-charging MOSFETQ3 through MOSFETQ4 are simultaneously brought into an ON state when the dual-port memory is brought into a state of non-selection, and the timing signal $\phi$pc is brought in a high level. Consequently, the non-inverted signal line and the inverted signal line of the corresponding complementary data line are short-circuited thereby pre-charging both lines into a half pre-charging level.

The unit amplifying circuits USA1 through USA2 in the sense amplifier SA1 are composed of two CMOS inverter circuits of which the respective input terminals and output terminals are cross-coupled with each other. The CMOS inverter circuits are supplied with the power source voltage Vcc of the circuit via a P-channel type drive MOSFETQ1 and a common source line SP. Also, they are supplied with the earth potential via an N-channel type drive MOSFETQ2 and a common source line NS. The gate of the drive MOSFETQ2 is supplied with the timing signal $\phi$pa from the timing control circuit TC, and the gate of the drive MOSFETQ1 is supplied with an inverted signal of the timing signal $\phi$pa inverted by an inverter circuit N1. By this, the unit amplifying circuits USA1 through USA2 in the sense amolifier SA1 are simultaneously brought into an operational state when the timing signal $\phi$pa is brought in a high level. In this operational state, each of the unit amplifying circuits USA1 through USA2 in the sense amplifier SA1 amplifiers a minute readout signal output via the corresponding complementary data lines D0·$\overline{D0}$ through Dn·$\overline{Dn}$ from m+1 memory cells coupled with selected word lines W0 through Wm and forms a binary readout signal of a high or low level.

The complementary data lines D0·$\overline{D0}$ through Dn·$\overline{Dn}$ are selectively connected to the complementary common data line CD1·$\overline{CD1}$ via the corresponding switches MOSFETQ5·Q6 through MOSFETQ7·Q8 in the column switch CSW1. The commonly connected gates of each pair of MOSFET switches in the column switch CSW1 are supplied with the corresponding data line selecting signals T0 through Yn from the random access port column address decoder RCD, respectively.

The random access port column address decoder RCD is not subjected to any limitation in particular, but it includes n+1 NAND gate circuits NAG1 through NAG2 and NAG3 through NAG4 as illustratedly shown in FIG. 1. The NAND gate circuits NAG1 through NAG2 have i+2 input terminals. Among them, the first through the i+1 th input terminals are supplied with the complementary internal address signals ay0 through ayi with a fixed combination in accordance with the column address of the corresponding complementary data line. Also, the i+2 th input terminal is supplied in common with the timing signal $\phi$yr. By this, the output signals of each NAND gate circuit NAG1 through NAG2 are usually brought in a high level. When the timing signal $\phi$yr is set at a high level, and the complementary internal address signals ay0 through ayi are made to be the corresponding combination, the above-mentioned output signals are alternatively placed at a low level.

The output signals of the NAND gate circuits NAG1 through NAG2 are supplied to the input terminals on one side of the corresponding NAND gate circuits NAG3 through NAG4, respectively. The terminals on the other side of these NAND gate circuits NAG3 through NAG4 are supplied in common with an inverted signal by an inverter circuit N3 of the timing signal $\phi$ad supplied from the timing control circuit TC. The output signals of the NAND gate circuits NAG3 through NAG4 are supplied to the gates of the corresponding MOSFET switches in the column switch CSW1 as the data line selecting signals Yo through Yn. As described previously, the timing signal $\phi$ad is temporarily set at a high level prior to effecting a selecting operation of the word line when the dual-port memory is brought into a clear operation mode. By this, the output signals of the NAND gate circuits NAG3 through NAG4, that is, the data line selecting signals Y0 through Yn are alternatively brought in a high level when the output signals of the corresponding NAND gate circuits NAG1 through NAG2 are brought in a low level, and simultaneously brought in a high level when the timing signal $\phi$ad is brought in a high level. In short, when the dual-port memory is brought into a normal operation mode, the data line selecting signals Y0 through Yn are alternatively brought into a state of selection as the timing signal $\phi$yr is set at a high level, and the Y address signals AY0 through AYi are brought to a high or low level with the corresponding combination. Also, when the dual-port memory is brought into a clear operation mode, the data line selecting signals Y0 through Yn are simultaneously brought to a selection state since the timing signal $\phi$ad is set at a high level prior to selecting operation of the word line.

The data line selecting signals Y0 through Yn are brought into a high level state of selection, and consequently, the corresponding switches MOSFETQ5·Q6 through MOSFETQ7·Q8 in the column switch CSW1 are brought into an ON state to connect the corresponding complementary data lines with complementary common data lines CD1·$\overline{CD1}$ selectively.

The complementary common data lines CD1·$\overline{CD1}$ are not subjected to any limitation in particular, but they are coupled in common with the output terminals of the corresponding write amplifier WA1 and the input terminals of the read amplifier RA1 via the corresponding pre-charging MOSFETQ90 in the random input-/output circuit RIO. Similarly, the complementary common data lines CD2·$\overline{CD2}$ through CD4·$\overline{CD4}$ provided correspondingly to the memory arrays M-ARY2 through M-ARY4 are coupled in common with the output terminals of the corresponding write amplifiers WA2 through WA4 and the input terminals of the corresponding read amplifiers RA2 through RA4, respectively.

Gates of pre-charging MOSFETQ9 through MOSFETQ12 are connected in common and supplied with the timing signal φpc from the timing control circuit TC. By this, as the dual-port memory is brought into a state of non-selection and the timing signal φpc is set at a high level, the pre-charging MOSFET Q9 through MOSFETQ 12 are simultaneously placed in an ON state so as to short-circuit the non-inverted signal lines and the inverted signal lines of the corresponding complementary common data lines CD1·$\overline{CD1}$ through CD4·$\overline{CD4}$ thereby precharging them to a fixed half pre-charging level. In short, in the dual-port memory in this embodiment, the pre-charging level of the complementary data lines D0·$\overline{D0}$ through Dn·$\overline{Dn}$ and that of the complementary common data lines $\overline{CD1}$·CD1 through $\overline{CD4}$·CD4 are both brought into a half precharging level equal to about ½ times the power source voltage Vcc. By this, when the dual-port memory is brought into a clear operation mode and the write amplifiers WA1 through WA4 perform a maskable writing operation in accordance with mask data, the variation in the level of the complementary data lines D0·$\overline{D0}$ through Dn·$\overline{Dn}$ in the memory array corresponding to masked bits can be prevented by the connection of the above-mentioned lines to the corresponding complementary common data lines.

Input terminals of the write amplifiers WA1 through WA4 in the random input/output circuit RIO are coupled with output terminals of the corresponding input buffers IB1 through IB4, respectively. These input terminals of the input buffers IB1 through IB4 are further respectively coupled with the corresponding input/output terminals IO1 through IO4. The input buffers IB1 through IB4 form complementary signals from write data and the like supplied via the corresponding input-/output terminals IO1 through IO4 from the outside and respectively transfer them to the corresponding write amplifiers WA1 through WA4. The non-inverted output signals from the input buffers IB1 through IB4 are further supplied to the input terminals of the corresponding bits in the mask register MR. The mask register is supplied with the timing signal φmw from the timing control circuit TC.

The dual-port memory in this embodiment is, as described later, commences when the level of the row address strobe signal $\overline{RAS}$ is changed from a high level to a low level. When the write enable signal $\overline{WE}$ and the data transfer control signal $\overline{DT/OE}$ are set at a low level prior to the change in level effected by the trailing edge of the row address strobe signal $\overline{RAS}$, the dual-port memory is placed in a clear operational mode. In this clear operational mode, through there is no special limitation, the X address signals AX0 through AXi which specifies the word line are supplied to the external terminals A0 through Ai in synchronism with the trailing edge of the row address strobe signal $\overline{RAS}$, and at the same time, and the mask data to be taken in the mask register MR are supplied to the external terminals via the input/output terminals IO1 through IO4. The write data are supplied to the input/output terminals IO1 through IO4 in synchronism with the trailing edge of the column address strobe signal $\overline{CAS}$. The timing signal φmw is temporarily set at a high level at the point in time when the trailing edge of the row address strobe signal $\overline{RAS}$ is detected in an operational mode of the dual-port memory.

The timing signal φmw is temporarily brought in a high level, and by this, the mask register MR takes in the mask data of four bits supplied from the input/output terminals IO1 through IO4 via the corresponding input buffers IB1 through IB4 and holds them. The mask data are not subjected to any limitation in particular, but they are set at a low level when write operation of the corresponding bits is executed without masking and are selectively set at a high level when the above-mentioned operation is not executed by being masked.

Output signals of respective bits in the mask register MR are supplied to input terminals on one side of corresponding NOR gate circuits NOG1 through NOG4. Terminals on the other side of these NOR gate circuits NOG1 through NOG4 are input in common with an inverted signal by an inverter circuit N2 of the timing signal φrw supplied from the timing control circuit TC. By this, the output signals of the NOR gate circuits NOG1 through NOG4 are selectively placed at a high level when the corresponding two input signals are both at a low level, namely, when the timing signal φrw is set at a high level and the corresponding non-inverted output signal in the mask register MR is at a low level. In short, the timing signal φrw for bringing the write amplifiers WA1 through WA4 into an operational state is transferred when the mask held in the corresponding bits in the mask register MR are at a low level, namely, when the write operation for the corresponding bits is not masked.

The output signals of the NOR gate circuits NOG1 through NOG4 are supplied to operation control terminals of the corresponding write amplifiers WA1 through WA4, respectively. Level control terminals of the write amplifiers WA1 through WA4 are supplied with the timing signal φad from the timing control circuit TC.

The write amplifiers WA1 through WA4 are selectively brought into an operational state in accordance with the timing signal φrw supplied via the corresponding NOR gate circuits NOG1 through NOG4. In this operational state, the write amplifiers WA1 through WA4 supply the complementary write signal in accordance with the write data supplied via the corresponding input buffers IB1 through IB4 from the corresponding input/output terminals IO1 through IO4 to the selected memory cell via the corresponding complementary common data lines CD1·$\overline{CD1}$ through CD4·$\overline{CD4}$.

Here, the level of the complementary write signal outputted from the write amplifier is controlled in accordance with the timing signal φad supplied as a level control signal. In other words, when the dual-port memory is placed in a normal write operation mode and the timing signal φad is set at a low level, the complementary write signals outputted from the write amplifiers WA1 through WA4 comprise a high level which corresponds to the power source voltage Vcc and a low level corresponding to reference ground or the ground potential of the circuit. On the one hand, when the dual-port memory is placed in a clear operation mode and the timing signal φad is set at a high level, the level of the complementary write signals outputted from the write amplifiers WA1 through WA4 is a minute level equal to or greater than that of readout signals outputted from memory cells.

Now, input/output nodes of respective memory cells which comprise the memory array M-ARY1 are alternately coupled with the non-inverted signal lines or the inverted signal lines of the corresponding complementary data lines D0$\phi\overline{D0}$ through Dn·$\overline{Dn}$ at fixed or regular intervals. Memory data in each memory cell are at a logic value "0" or "1" depending on the presence or absence of charge stored in the information storing capacitor Cs of the cell. In other words, for example, in the case where the input/output nodes are cells coupled with the non-inverted signal line of the complementary data line, the corresponding word lines are brought into a state of selection of a high level, and consequently, the address selecting MOSFETQm is brought into an ON state. At this time, if the non-inverted signal line of the corresponding data line is supplied with a signal of a logical value "0", that is, a write signal of a low level, charge stored in the information storing capacitor Cs is discharged, and if the non-inverted signal line of the corresponding complementary data line is supplied with a signal of a logical value "1", that is, a signal of a high level, charge is put into the information storing capacitor Cs. Consequently, the potential on the electrode on the side of the address selecting MOSFETQm is made substantially equal to the power source voltage Vcc. When the memory cell is selected during a readout operation mode, a minute readout signal having a value in accordance with the charge stored in the information storing capacitor Cs, for example, a value of about 200 mV is outputted on the non-inverted signal line of the corresponding data line, and its level is higher than that of the pre-charging level by about 200 mV. At this time, the non-inverted signal line of the corresponding complementary data line is left at the level equal to the pre-charging level. The difference in level caused on the complementary data line is promptly amplified by the corresponding unit amplifying circuit of the sense amplifier SA1 to produce a binary readout signal of a high or low level.

When the dual-port memory is placed in a normal write operation mode, the write amplifiers WA1 through WA4 are brought into an operational state at the point in time when selecting operation of the word line ends, and readout signals of n+1 memory cells coupled with selected word lines are established by the corresponding sense amplifier. Accordingly, in order to rewrite stored data in selected memory cells, a write signal having a level sufficient to allow the established readout signal to be inverted is needed. For this, complementary write signals outputted from the write amplifiers WA1 through WA4 during a normal write operation mode are subjected to a full swing between a high level and a low level. On the other hand, when the dual-port memory is placed in a clear operation mode, the write amplifiers WA1 through WA4 are temporarily placed in an operational state prior to a selecting operation of the word lines. As this time, the write signals outputted from the write amplifiers WA1 through WA4 are complementary common data line signals having a level equal to the pre-charging level as a center value, and their positive or negative signal amplitude is a minute level, for example, about 200 mV, about equal to that of the readout signal of the memory cell. The write operation ends and further the selecting operation ends, and then the memory cells are brought into a state of selection. By that, when the minute readout signal is outputted in accordance with the stored data held in the memory cells till then, the level of the non-inverted signal line of the corresponding complementary data line is varied. In other words, in the case where the memory data which has been held in the memory cells has a logical value "0" and further the newly written data has a logical value "0", the level of the readout signal of the memory cell is superposed on that of the non-inverted signal line, which becomes a level lowered by, for example, about 400 mV from the half pre-charging level. The level of the inverted signal line becomes a level raised by, for example, about 200 mV from the half pre-charging level without being influenced by the readout signal. At this time, in the case where the level of the new write data has a logical value "1", the level of the non-inverted signal line is cancelled by the readout signal of the memory cell and returned to the half pre-charging level. The level of the inverted signal line becomes a level lowered by, for example, about 200 mV from the half pre-charging level without being influenced by the readout signal.

On the other hand, in the case where the memory data of a logical value "1" has been held in the memory cell till then and a write operation of memory data of a logical value "0" is newly executed, the level of the non-inverted signal line is cancelled by the readout signal of the memory cell returned to the pre-charging level. The level of the inverted signal line becomes a level raised by, for example, about 200 mV from the half pre-charging level without being influenced by the readout signal. At this time, in the case where a new write data has a logical value "1", the level of the readout signal of the memory cell is superposed on that of the non-inverted signal line, which becomes a level raised by, for example, about 400 mV from the half pre-charging level. Also, the level of the inverted signal line becomes a level lowered by, for example, about 200 mV from the half pre-charging level similarly without being influenced by the readout signal.

In short, though, in the clear operation mode of the dual-port memory, the complementary write signal output from the write amplifiers WA1 through WA4 is made to have a minute level nearly equal to that of the readout signal output from the memory cell, the difference in level being equal to or greater than that of the readout signal outputted from the memory cell, after completion of writing, is left on the complementary data line. The difference in level in the complementary data line is expanded when the corresponding sense amplifier is brought into an operational state, producing a binary signal of a high or low level. As a result, charge equal to that in write operation of full swing which is performed in a normal write operation mode is injected into the information storing capacitor Cs in the selected memory cell.

Figure 3:
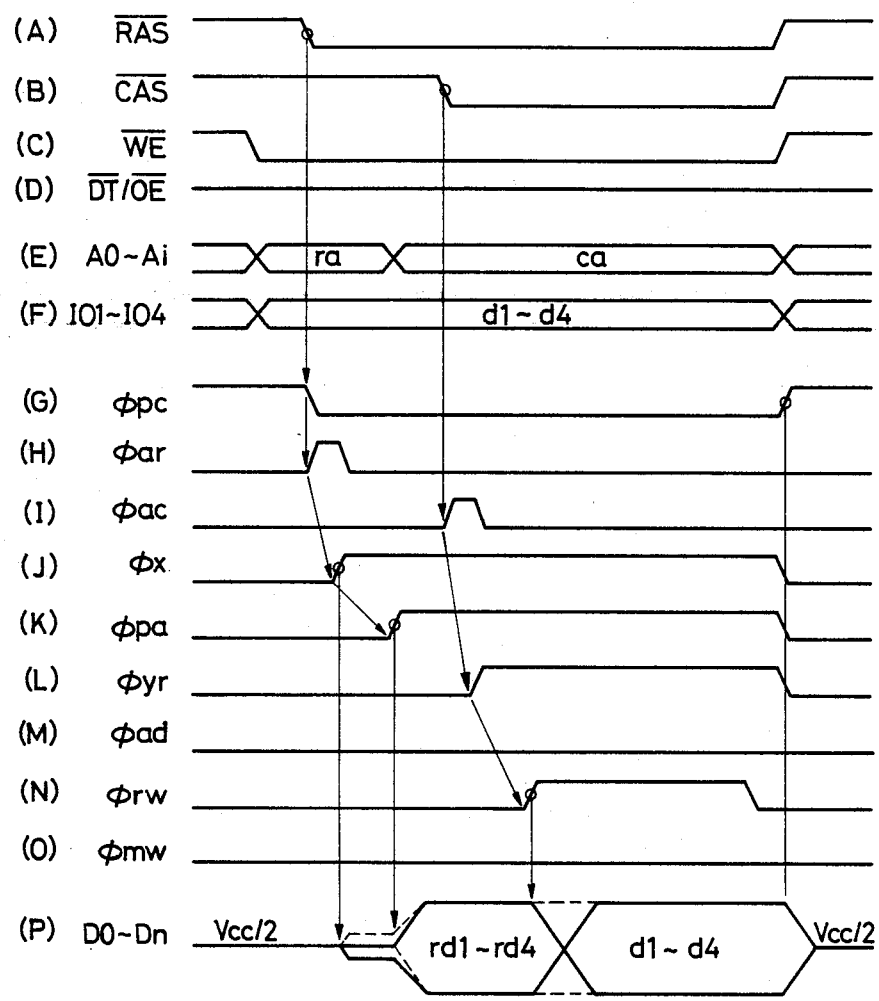
FIG. 3 is a timing chart showing an embodiment of a normal write operation mode for the dual-port memory shown in FIG. 2.

FIG. 3 shows a timing chart of an embodiment of a normal write operation mode for the dual-port memory shown in FIG. 2.

In FIG. 3, the dual-port memory is not subjected to any limitation in particular, but it is started by the transition of the row address strobe signal RAS from a high level to a low level. Prior to the last transition of this row address strobe signal $\overline{RAS}$, the write enable signal $\overline{WE}$ is set at a low level and the data transfer control signal $\overline{DT/OE}$ is left at a high level. By this, the dual-port memory determines that this memory cycle is in a normal write mode. The external terminals A0 through Ai are, at first, supplied with a row address ra in the memory cell to be selected, and the data input/output terminals IO1 through IO4 are supplied with write data of four bits d1 through d4.

When the row address strobe signal $\overline{RAS}$ changes to a low level in the dual port memory, the timing signal $\phi pc$ is changed to a low level and at the same time, the timing signal $\phi ar$ is temporarily brought to a high level. Furthermore, the timing signals $\phi x$ and $\phi pa$ following brief delays are then set at a high level in that order.

When the timing signal $\phi pc$ is changed to a low level, the pre-charging operations of the complementary data lines D0·$\overline{D0}$ through Dn·$\overline{Dn}$ and the complementary common data lines CD1·$\overline{CD1}$ through CD4·$\overline{CD4}$ are stopped. Also, when the timing signal $\phi ar$ is temporarily brought to a high level, the row address ra is put in the row address buffer RADB. Furthermore, when the timing signal $\phi x$ is subsequently set at a high level, the word line selecting operation by the row address decoder RD is begun, and one word line corresponding to the row address ra is alternatively brought to a high level signal condition which is a selection state condition. By this, minute readout signals in accordance with the stored data having, for example, a signal amplitude of about 200 vM are outputted to the complementary data lines D0·$\overline{D0}$ through Dn·$\overline{Dn}$ of each memory array from n+1 memory cells coupled with this word line, respectively. These minute readout signals are amplified when the timing signal $\phi pa$ is set at a high level and the respective unit amplifying circuitry of the corresponding sense amplifiers SA1 through SA4 are simultaneously brought into an operational state, wherein the minute signals become binary signals of a high or low level rd1 through rd4 and the like.

Next, the column address strobe signal $\overline{CAS}$ is changed from a high level to a low level. Prior to change of the last transition of the column address strobe signal $\overline{CAS}$, the external terminals A0 through Ai are supplied with the column address ca in the memory cell to be selected.

When the column address strobe signal $\overline{CAS}$ is is changed from a high to a low level in the dual-port memory, the timing signal $\phi ac$ is temporarily set at a high level. Also, the timing signal $\phi yr$ is set at a high level following a short delay, and subsequent to a further delay the timing signal $\phi rw$ is temporarily changed to a high level with a fixed pulse width.

When the timing signal $\phi ac$ is temporarily set at a high level, the column address ca is put in the column address buffer CADB. Also, when the timing signal $\phi yr$ becomes a high level, the random access port column address decoder RCD is brought into an operational state and the data line selecting signals Y0 through Yn corresponding to the column address ca are alternatively brought into a selection state which correspond to a high level. By this, the switches MOSFETQ5·Q6 through Q7·Q8 corresponding to the column switches CSW1 through CSW4 are alternatively brought into an ON state from an OFF state, and one set of the complementary data lines D0·$\overline{D0}$ through Dn·$\overline{Dn}$ corresponding to the column address ca of each memory are connected to the corresponding write amplifiers WA1 through WA4 in the random input/output circuit RIO via the corresponding complementary common data lines CD1·$\overline{CD1}$ through CD4·$\overline{CD4}$, respectively.

When the timing signal $\phi rw$ is temporarily set at a high level, the write amplifiers WA1 through WA4 are simultaneously brought into an operational state. As a result, the selected complementary data lines in the memory arrays M-ARY1 through M-ARY4 are supplied with the full swing complementary write signal in accordance with the write data d1 through d4 via the corresponding complementary common data lines CD1·$\overline{CD1}$ through CD4·$\overline{CD4}$. Accordingly, the level of each of the selected complementary data lines is forcibly inverted as required and becomes a level in accordance with the write data d1 through d4. As a result, charge in accordance with the write data d1 through d4 is injected into the selected memory cell in each memory array. At this time, on the other complementary data lines which are not connected to the complementary common data lines CD1·$\overline{CD1}$ through CD4·$\overline{CD4}$ in each memory array, the readout signal output from each memory cell is written into the corresponding memory cell once more to fresh the held data.

Figure 4:
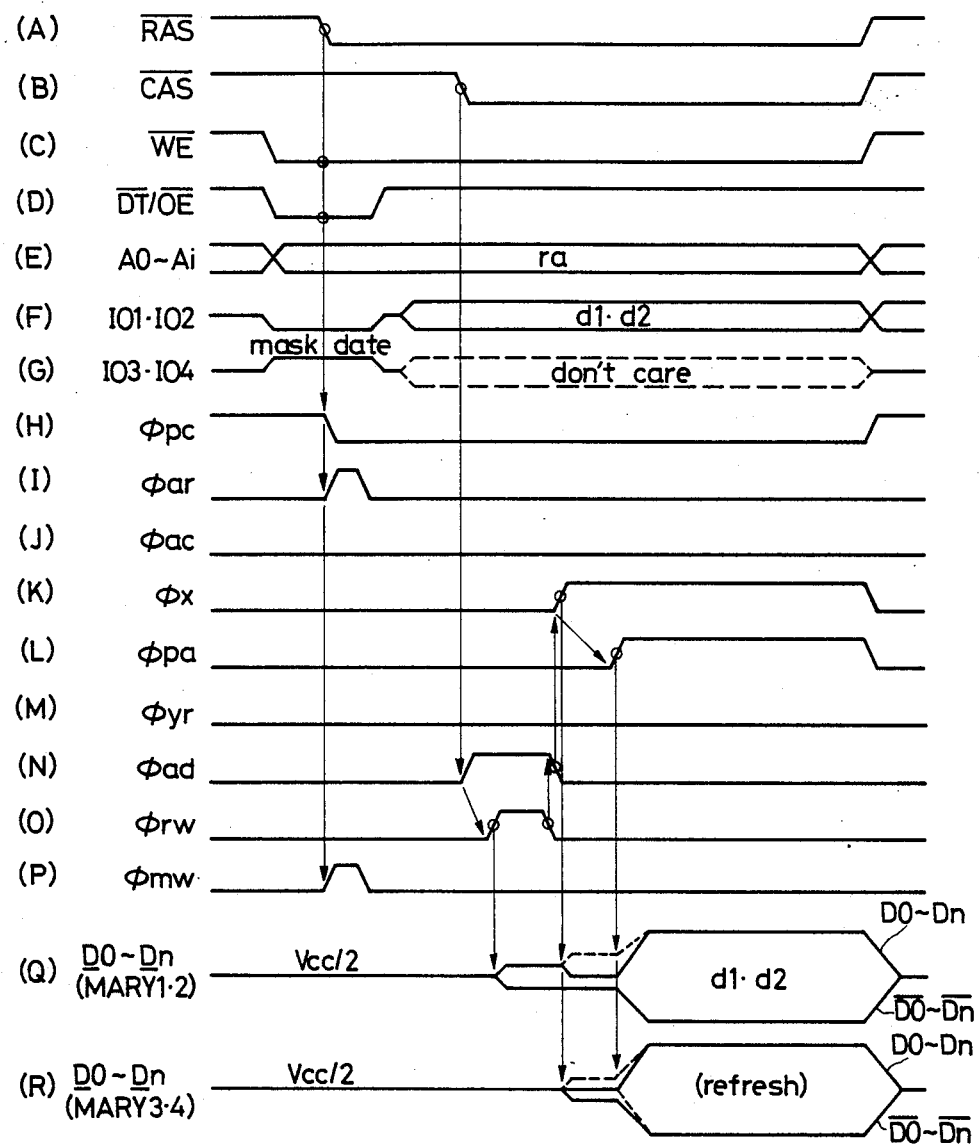
FIG. 4 is a timing chart showing an embodiment of a clear operation mode for the dual-port memory.

FIG. 4 shows a timing chart for an embodiment of a clear operation mode of the dual port memory in FIG. 2. In the embodiment in FIG. 4, the clear operation of bits corresponding to the input/output terminals IO1 and IO2 is not masked and that of bits corresponding to the input/output terminals IO3 and IO4. The selected memory cell is connected to the non-inverted signal line of the corresponding complementary data line. The cases where the memory cell has held stored data of logical values "0" and "1" till then are shown by a solid line and a dotted line, respectively. The write data d1 and d2 written in a clear operation mode are both brought to a logical value "1". Hereinafter, the summary of the clear operation mode of the dual port memory in this embodiment will be described with reference to FIG. 4.

In FIG. 4, the dual port memory is started by transition of the row address strobe signal $\overline{RAS}$ from a high level to a low level in the same way as in the normal write operation mode shown in FIG. 3. Prior to the last transition of the row address strobe signal $\overline{RAS}$, the write enable signal $\overline{WE}$ and the data transfer control signal $\overline{DT/OE}$ are brought to a low level. By this, the dual port memory decides that this memory cycle is in a clear operation mode. The external terminals A0 through Ai are supplied with the row address ra of the word line to be selected. Also, the input/output terminals IO1 and IO2 are supplied with the mask data of a logical value "0", that is, a low level, and the input/output terminals IO3 and IO4 are supplied with the mask data of a logical value "1", that is, a high level.

In the dual port memory, when the row address strobe signal $\overline{RAS}$ is changed from a high level to a low level, the timing signal $\phi c$ becomes a low level, and simultaneously, the timing signals $\phi ar$ and $\phi mw$ are temporarily raised to a high level.

When the timing signal $\phi pc$ is set at a low level, precharging operation of the complementary data lines D0·$\overline{D0}$ through Dn·$\overline{Dn}$ and the complementary common data lines CD1·$\overline{Cd1}$ through CD4·$\overline{CD4}$ is stopped. When the timing signal $\phi ar$ is temporarily raised to a high level, the row address ra is put in the row address buffer RADB, and when the timing signal $\phi mw$ is temporarily raised to a high level, mask data of four bits are put in the mask register MR in the random input/output circuit RIO.

Next, after a fixed time period elapses, the data transfer control signal $\overline{DT/OE}$ is restored to a high level and the column address strobe signal $\overline{CAS}$ is changed from a high level to a low level. Prior to the last transition of the column address strobe signal $\overline{CAS}$, the input/output terminals IO1 and IO2 are both supplied with the write data d1 and d2 of a logical value "1". At this time, the input/output terminals IO3 and IO4 are both left in a Don't Care state. The write data d1 and d2 are converted into complementary signals by the input buffers IB1 and IB2 in the random input/output circuit RIO, and are further supplied to the corresponding write amplifiers WA1 and WA2.

In the dual port memory, when the column address strobe signal $\overline{CAS}$ becomes a low level, the timing signal $\phi ad$ is temporarily raised to a high level, and the timing signal $\phi rw$, after a delay, is temporarily raised to a high level and it has a pulse width so as to be included within the timing signal $\phi ad$ pulse width. Also, the timing signal $\phi x$ changes to a high level at the point in time when the timing signals $\phi ad$ and $\phi rw$ are both restored to a low level, and after a slight delay the timing signal $\phi pa$ is raised to a high level.

When the timing signal $\phi ad$ is temporarily raised to a high level, the random access port column address decoder RCD is brought into an operational state, and all of the data line selecting signals Y through Yn are temporarily brought into a state of selection of a high level in synchronism with the timing signal $\phi ad$. By this, all of the switches MOSFETQ5·Q6 through Q7·Q8 are brought into an ON state, and all of the complementary data lines D0·$\overline{D0}$ through Dn·$\overline{Dn}$ in each memory are simultaneously connected to the corresponding write amplifiers WA1 through WA4 in the random input/output circuit RIO via the corresponding complementary common data lines CD1·$\overline{CD1}$ through CD4·$\overline{CD4}$.

The timing signal $\phi rw$ which is temporarily raised to a high level following a slight delay from that of the timing signal $\phi ad$ is selectively transferred to the write amplifiers WA1 and WA2 in accordance with the mask data taken in by the mask register MR. As a result, the write amplifiers WA1 and WA2 are brought into an operational state, and the complementary common data lines CD1·$\overline{CD1}$ and CD2·$\overline{CD2}$ are supplied with the complementary write signal of a logical value "1" in accordance with the write data d1 and d2. At this time, since the write amplifiers WA1 and WA2 are simultaneously supplied with the timing signal $\phi ad$ of a high level, the complementary write signal output from the write amplifiers WA1 and WA2 is made to have a minute level nearly equal to that of the readout signal from the memory cell. In other words, the level of the non-inverted signal line CD1 and CD2 is made to have a level higher than the half pre-charging level by, for example, about 200 mV, and the level of the inverted signal line $\overline{CD1}$ and $\overline{CD2}$ is made to have a level lower than the half pre-charging level by, for example, about 200 mV. The write amplifiers WA3 and WA4 are not brought into an operational state when the corresponding mask data is brought in a low level of a logical value "0".

As the complementary write signal of a minute level is supplied from the write amplifiers WA1 and WA2, the level of all of the complementary data lines D0·$\overline{D0}$ through Dn·$\overline{Dn}$ in memory arrays M-ARY1 and MAR2 is made equal to that of the complementary write signal supplied via the corresponding complementary common data lines CD1·$\overline{CD1}$ and CD2·$\overline{CD2}$. Thus, the level of the non-inverted signal line of all the complementary pairs of data lines in the memory arrays M-ARY1 and M-ARY2 is made to have a level higher than that of the half pre-charging level by, for example, about 200 mV, and the level of each of the inverted signal lines is made to have a level lower by, for example, about 200 mV. At this time, the level of the complementary common data lines CD3·$\overline{CD3}$ and CD4·$\overline{CD4}$ corresponding to a masked level of logical "0" and that of the all of the corresponding complementary data lines D0·$\overline{D0}$ through Dn·$\overline{Dn}$ in the memory arrays M-ARY3 and M-ARY4 remain equal to the pre-charging level.

When the timing signals $\phi ad$ and $\phi rw$ are both returned to a low level and, in place of them, the timing signal $\phi x$ is raised to a high level, the word line selecting operation by the row address decoder RD is started, and the word lines corresponding to the row address ra in the memory arrays M-ARY1 through ARY4 are alternatively brought from a non-selection state into a state of selection of a high level. Accordingly, the complementary data lines D0·$\overline{D0}$ through Dn·$\overline{Dn}$ in each memory array are supplied with minute readout signals having a signal amplitude, for example, of about 200 mV in accordance with stored data which have been held till then from the n+1 memory cells coupled with the selected work line, respectively.

At this time, as shown by the solid line in FIG. 4, in the case where the readout signal of a logical value "0" is output from the memory cell coupled with the non-inverted signal line of the complementary data line, the level of the non-inverted signal line of the complementary data line is cancelled and returned to the substantially half pre-charging level Vcc/2. In contrast with this, the level of the corresponding inverted signal line of the complementary data line is left in a lower level than the half pre-charging level by, for example, about 200 mV without being influenced by the readout signal. On the other hand, at this time, as shown by the dotted line in FIG. 4, in the case where the readout signal of a logical value "1" is output from the cell coupled with the non-inverted line of the complementary data line, the level of the readout signal is superposed on the level of the non-inverted signal line of the complementary data line and is made to have a higher level than the pre-charging level by about 400 mV. The level of the corresponding inverted signal line of the complementary data line is similarly left in a lower level than the half pre-charging level by about 200 mV without being influenced by the readout signal. In short, at the point in time when the selecting operation of the word line has ended, through a minute readout signal in accordance with the previously stored data is being outputted, the difference in the level in accordance with the corresponding readout data remaining between the non-inverted signal line and the inverted signal line of each complementary data line. The difference of level is, of course, made to have a maximum value of, for example, about 600 mV and a minimum value of about 200 mV.

When the timing signal $\phi pa$ is raised to a high level following a slight delay from the rise of the timing signal $\phi x$, all of the unit amplifying circuits in the sense amplifiers SA1 through SA4 are simultaneously activated into an operational state. By this, the difference in level yielded in each complementary data line pair in each memory array together with the selecting operation of the word line is rapidly amplified thereby resulting in a binary signal of a high or low level. When the difference in level between the non-inverted signal line and the inverted signal line of the complementary data line pair is enlarged to an amplitude of the full swing, stored data in selected n+1 memory cells corresponding to a selected word line in the memory arrays M-ARY1 and M-ARY2 are simultaneously rewritten in accordance with new write data d1 and d2.

Now, the write signal is not transferred on each complementary data line in the memory arrays, and fixed differences in level result in accordance with the minute readout signal output from the selected cell. Since these differences in level are rapidly amplified by the each unit amplifying circuit in the corresponding sense amplifiers SA3 and SA4, the stored data held in each memory cell thereby becomes refreshed.

As described above, the dual port memory has a clear function in that stored data in memory cells are simultaneously rewritten per each word line. In this clear operation mode, all of the complementary data lines D0·$\overline{D0}$ through Dn·$\overline{Dn}$ in each memory array are temporarily brought into a state of selection prior to the selecting operation of the word line, and the level of the complementary write signal output from the write amplifiers WA1 through WA4 is made to have a minute level equal or greater than that of the readout signal output from the memory cell. Since the write amplifiers WA1 through RA4 are selectively placed into an operational state in accordance with the mask data supplied in advance, a maskable clear processing in accordance with a desired color display can be implemented. Also, in this time, the pre-charging levels of each complementary data line and each complementary common data line are both made to have such a half pre-charging level as ½ times the power source voltage Vcc. In the dual port memory in this embodiment, therefore, a rapid and stable clear function adapted to, for example, a function of a buffer memory for picture frames can be realized. These functions can be utilized for simultaneous write operation besides a clear operation. As shown in the foregoing present embodiment, the application of this invention to semiconductor memory units such as a dual port memory and the like permits following operational effects to be obtained. Namely, (1) The clear operation mode is executed per each word line with all of the data lines brought into a state of selection. At this time, when the write amplifiers are temporarily brought into an operational state before the selecting operation of the word line is started since the all of the data lines are brought into a state of selection, the effect that the clear operation mode in semiconductor memory units such as a dual port memory and the like can be executed with a high speed, and, at the same time, the level of the write signal can be arbitrarily set can be obtained.

(2) When, in the clear operation mode, the level of the complementary write signal output from the write amplifier is a minute level equal to or greater than that of the readout signal output from the memory cell, the effect that the write current in the clear operation mode of semiconductor memory units of a dual-port memory and the like is largely reduced to allow its low power consumption to be tried can be obtained.

(3) When, in the clear operation mode, a plurality of write amplifiers provided correspondingly to a plurality of input terminals are selectively brought into an operational state in accordance with the mask data supplied in advance, the effect that a maskable clear operation can be executed correspondingly to, for example, a color factor can be obtained.

(4) When the clear operation mode is executed via the random access port in the dual-port memory, the effect that the clear operation can be performed, for example, while picture displaying is performed, in other words, alteration of a color of a background of a displayed picture and the like can be simultaneously performed together with the input/output operation by use of the serial access port in the dual-port memory can be obtained.

(5) When, in the clear operation mode, the pre-charging level of the data line in each memory array is made equal to that of the common data line, the effect that the variation in the level of the data line in the memory array corresponding to the masked bit is prevented to allow a stable clear operation mode to be realized can be obtained.

(6) The effect that the semiconductor memory unit such as a dual-port memory adapted to a buffer memory for picture frames and the like and provided with a rapid and stable clear function can be realized can be obtained.

The invention invented by the inventors has been specifically described based on the embodiment as mentioned above. This invention is not restricted to the above-mentioned embodiment, but it is needless to say that the invention can be variously modified within the range without departing from the spirit and scope of the invention. For example, in the dual-port memory, when the row address strobe signal $\overline{RAS}$ is brought in a low level after the write enable signal $\overline{WE}$ and the data transfer control signal $\overline{DT/OE}$ are brought in a low level, the clear operation mode is distinguished. But, a special control signal for specifying a clear operation mode can be, for example, provided, and the control signal can be combined with the other control signal. In the clear operation mode, the level of the complementary write signal output from each write amplifier is not always equal to that of the readout signal from the memory cell, and it may be such an arbitrary level as to cancel the readout signal and allow the necessary difference in level to be left. In this embodiment, the write amplifiers WA1 through WA4 are brought into an operational state in accordance with the mask data. But, for example, when the NAND gate circuits NAG3 through NAG4 in the random access port column address decoder RCD are provided per each memory array, and the input terminals on the other side of these NAND gate circuits are selectively supplied with the timing signal φad in accordance with mask data, all of the complementary data lines in each memory array may be selectively brought into a state of selection in accordance with the mask data. Also, these mask data may be supplied to the dual-port memory by an independent memory cycle for supplying the mask data, and may be supplied from the external terminals except the input/output terminals IO1 through IO4. In this embodiment, a signal having a full swing is used as the write signal in the normal write operation mode. But, the write signal is output from the write amplifier prior to selection of the word line similarly as in the clear operation mode, and the level of the output may be used as the minute write signal of a level equal to or greater than that of the readout signal. For the memory arrays M-ARY1 through M-ARY4, the sense system in which each data line is disposed, sandwiching the sense amplifiers SA1 through SA4, on the both side may be adopted. Furthermore, not less than eight sets of the input/output terminals, the common data line, the write amplifiers, the memory array, and the like may be provided. Also, various embodiments can be adopted as of the structures of the random input/output circuit RIO and the specific circuit of the circumferential part thereof shown in FIG. 1, the structures of the blocks of the dual port memory shown in FIG. 2, the combinations of the control signals shown in FIG. 3 and FIG. 4 and the like.

In the foregoing description, the case where the invention invented by the present inventors is applied to the dual-port memory which relates to the utilization field in the background of the invention has been described, but the invention is not restricted to it. For example, the invention is applicable to various kinds of semiconductor memory units such as ordinary dynamic type RAMs, etc. The present invention is widely applicable at least to semiconductor memory units in which sense amplifiers are provided correspondingly to each data line and digital units containing therein such semiconductor memory units.

What is claimed is:

1. A semiconductor memory comprising: a memory array comprised of a plurality of data lines and word lines disposed in an arrangement of perpendicularly intersecting data lines and word lines, and a plurality of memory cells respectively disposed like a lattice at intersections of said data lines and word lines;
   a plurality of sense amplifiers, each one being coupled to a respective data line, and wherein said plurality of sense amplifiers are selectively placed in an operational state in accordance with a predetermined timing signal;
   a row address decoder, in response to row address signals, providing word line signals at selected word lines thereby placing them in a selected state condition;
   column switches being coupled between said plurality of data lines and common data lines for providing selective or simultaneous connection of said plurality of data lines to said common data lines;
   write amplifiers, coupled to said common data lines, supplying predetermined write signals to data lines brought into a state of connection with said common data lines via said column switches; and
   wherein said sense amplifiers are place in an operational state during a predetermined operation mode after write signals are supplied from said write amplifiers to data lines brought into a state of connection to said common data lines.

2. A semiconductor memory according to claim 1 wherein
   said data lines and common data lines are used as complementary signal lines, and
   in said predetermined operation mode, write signals supplied from said write amplifiers are made to have a minute level equal to or greater than that of readout signals outputted from memory cells brought into a state of selection.

3. A semiconductor memory according to claim 2 wherein
   said predetermined operation mode is a clear operation mode which is carried out per a plurality of memory cells coupled with said word lines respectively.

4. A semiconductor memory according to claim 3 wherein
   said semiconductor memory is a dual port memory having both a random access port and a serial access port, and
   said clear operation mode is executed at an arbitrary timing via said random access port regardless of an operational state of said serial access port.

5. A semiconductor memory according to claim 4 wherein
   a plurality of sets of said common data lines and said write amplifiers are provided, and
   said plurality of write amplifiers are selectively brought into an operational state in accordance with predetermined data supplied externally of said memory during said clear operation mode.

6. A semiconductor memory according to claim 5 wherein
   furthermore, respective bits are provided to each one of said plurality of write amplifiers, and wherein mask registers for holding mask data are included.

7. A semiconductor memory according to claim 6 wherein
   said complementary data lines and said common data lines are pre-charged to the same level when said semiconductor memory unit is brought into a state of non-selection.

8. A semiconductor memory according to claim 7 wherein
   said complementary data lines and said common data lines are pre-charged to a substantially intermediate level between a power source voltage and ground potential.

9. A semiconductor memory according to claim 8, wherein each one of said plurality of data lines and said common data lines comprises a pair of complementary data signal lines and a pair of complementary common data signal lines, respectively.

10. A semiconductor memory according to claim 9, further including pre-charging means for effecting a short-circuit within each one of said pairs of complementary data signal lines and complementary common data signal lines during a pre-charging mode of operation, wherein a pre-charging level results which is intermediate the level of a power source voltage used for operating said sense amplifiers and write amplifiers.

11. A semiconductor memory according to claim 10, wherein each pair of complementary common data signal lines corresponds to a respective write amplifier, which is associated with a separate external input/out terminal, and an array of pairs of complementary data lines which are associated with intersecting word lines and corresponding memory cells disposed like a lattice.

12. A semiconductor memory according to claim 1, wherein each one of said plurality of data lines and said common data lines comprises a pair of complementary data signal lines and a pair of complementary common data signal lines, respectively.

13. A semiconductor memory according to claim 12, further including pre-charging means for effecting a short-circuit within each one of said pairs of complementary data signal lines and complementary common data signal lines during a pre-charging mode of operation, wherein a pre-charging level results which is intermediate the level of a power source voltage used for operating said sense amplifiers and write amplifiers.

14. A semiconductor memory according to claim 13, wherein each pair of complementary common data signal lines corresponds to a respective write amplifier, which is associated with a separate external input/out terminal, and an array of pairs of complementary data signal lines which are associated with intersecting word lines and corresponding memory cells disposed like a lattice.

15. A semiconductor memory comprising:
    a memory array comprised of a plurality of data lines and word lines disposed in an arrangement of perpendicularly intersecting data lines and word lines, and a plurality of memory cells respectively disposed like a lattice at intersections of said data lines and word lines;

a plurality of sense amplifiers, each one being coupled to a respective data line, and wherein said plurality of sense amplifiers are selectively placed in an operational state in accordance with a predetermined timing signal;

a row address decoder, in response to row address signals, providing word line signals at selected word lines thereby placing them in a selected state condition;

column switches being coupled between said plurality of data lines and common data lines for placing said data lines alternatively into a selective state of connection of said common data lines during a normal operation mode and bringing said plural data lines simultaneously into a state of connection to said common data lines during a predetermined clear operation mode; and write amplifiers, coupled to said common data lines, supplying predetermined write signals to data lines brought into a state of connection with said common data lines via said column switches.

16. A semiconductor memory according to claim 15 wherein a plurality of sets of said common data lines and said write amplifiers are provided, and said plurality of write amplifiers are selectively brought into an operational state in accordance with predetermined data supplied externally of said memory.

* * * * *